(12) United States Patent
Krishnamoorthy

(10) Patent No.: US 6,237,117 B1
(45) Date of Patent: May 22, 2001

(54) METHOD FOR TESTING CIRCUIT DESIGN USING EXHAUSTIVE TEST VECTOR SEQUENCE

(75) Inventor: Suresh Krishnamoorthy, Milpitas, CA (US)

(73) Assignee: Sun Microsystems, Inc.

( * ) Notice: Subject to any disclaimer, the term of this patent is extended or adjusted under 35 U.S.C. 154(b) by 0 days.

(21) Appl. No.: 09/164,408

(22) Filed: Sep. 30, 1998

(51) Int. Cl.[7] .......................... G01R 31/28; G06F 11/00; G11C 29/00
(52) U.S. Cl. .......................... 714/724; 714/741; 714/740; 714/718
(58) Field of Search ..................... 714/724, 718, 714/735, 736, 740, 741, 738, 25

(56) References Cited

U.S. PATENT DOCUMENTS

| | | | | |
|---|---|---|---|---|
| 4,763,289 | * | 8/1988 | Barzilai et al. ...................... | 364/578 |
| 5,426,770 | * | 6/1995 | Nuber .................................... | 395/500 |
| 5,444,717 | * | 8/1995 | Rotker et al. ......................... | 371/27 |
| 5,640,403 | * | 6/1997 | Ishiyama et al. ..................... | 371/26 |
| 5,671,352 | * | 9/1997 | Subrahmaniam et al. ........ | 395/183.17 |
| 5,910,958 | * | 6/1999 | Jay et al. ............................... | 371/27.1 |
| 5,944,847 | * | 8/1999 | Sanada .................................. | 714/741 |
| 6,067,651 | * | 5/2000 | Rohrbaugh et al. ................. | 714/738 |
| 6,085,343 | * | 7/2000 | Krishnamoorthy ................... | 714/724 |

\* cited by examiner

*Primary Examiner*—Albert Decady
*Assistant Examiner*—Samuel Lin
(74) *Attorney, Agent, or Firm*—Philip J. McKay; Gunnison, McKay & Hodgson, L.L.P.

(57) ABSTRACT

A method for testing sequential circuit designs in which an exhaustive sequence of test vectors is applied to the input nodes of edge-sensitive components of a simulated sequential circuit. The test vector values are selected from a group including a logic "1" (high), a logic "0" (low), a "floating" value (i.e., between logic "1" and logic "0") and a randomly generated ("don't care") value. While a predetermined combination of values is applied to all other input nodes of the simulated circuit, the sequence of test vector values is applied to a selected input node that produces all possible transitions between the test vector values. The predetermined combination of values applied to all other input nodes is then incrementally changed, and the test vector value sequence is repeated.

20 Claims, 5 Drawing Sheets

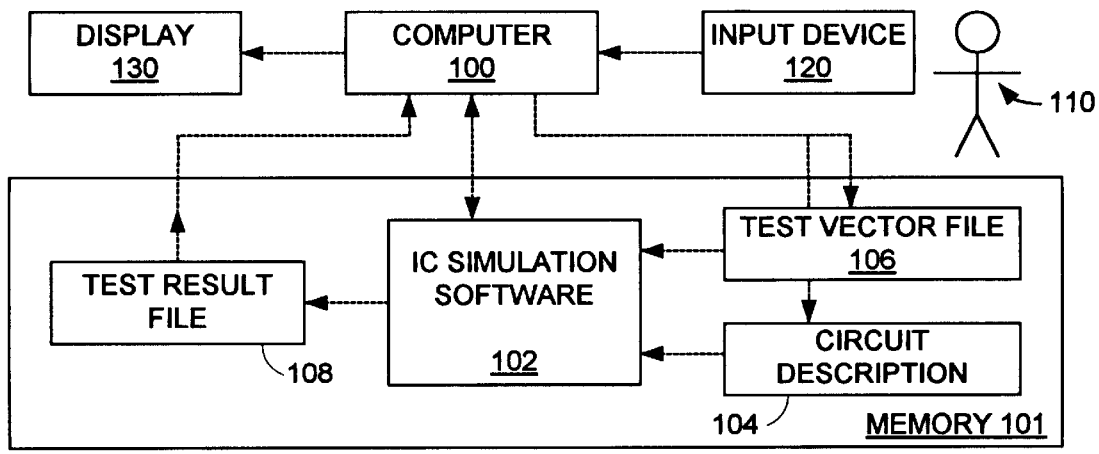
FIG. 1(A) (PRIOR ART)
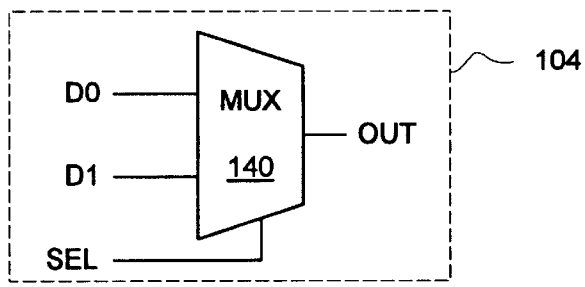
FIG. 1(B) (PRIOR ART)
| TEST VECTOR FILE 106 | | | |
|---|---|---|---|
| VECTOR | D0 | D1 | SEL |
| 0 | 0 | 0 | 0 |
| 1 | 0 | 0 | 1 |
| 2 | 0 | 1 | 0 |
| 3 | 0 | 1 | 1 |
| 4 | 1 | 0 | 0 |
| 5 | 1 | 0 | 1 |
| 6 | 1 | 1 | 0 |
| 7 | 1 | 1 | 1 |
FIG. 1(C) (PRIOR ART)
| TEST RESULT FILE 108 | | | |
|---|---|---|---|
| VECTOR | OE | OA | ERR? |
| 0 | 0 | 0 | NO |
| 1 | 0 | 0 | NO |
| 2 | 0 | 0 | NO |
| 3 | 1 | 1 | NO |
| 4 | 1 | 1 | NO |
| 5 | 0 | 0 | NO |
| 6 | 1 | 1 | NO |
| 7 | 1 | 1 | NO |
FIG. 1(D) (PRIOR ART)

| TEST VECTOR FILE 106(2) | | | |
|---|---|---|---|
| VECTOR | CLK | D3 | RST |
| 0 | 0 | 0 | 0 |
| 1 | 0 | 0 | 1 |
| 2 | 0 | 1 | 0 |
| 3 | 0 | 1 | 1 |
| 4 | 1 | 0 | 0 |
| 5 | 1 | 0 | 1 |
| 6 | 1 | 1 | 0 |
| 7 | 1 | 1 | 1 |

| TEST RESULT FILE 108(2) | | | |
|---|---|---|---|
| VECTOR | OE | OA | ERR? |
| 0 | 0 | 0 | NO |
| 1 | 0 | 0 | NO |
| 2 | 0 | 0 | NO |
| 3 | 1/0 | 0 | ? |
| 4 | 0 | 1/0 | ? |
| 5 | 0 | 1/0 | ? |
| 6 | 1 | 1/0 | ? |
| 7 | 1/0 | 1/0 | ? |

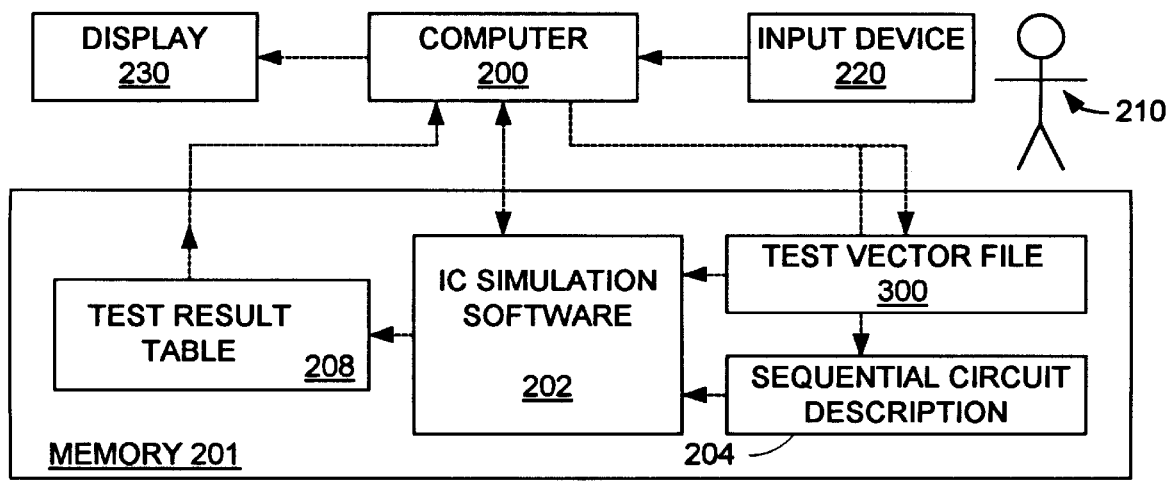

| TEST VECTOR FILE 300-5 | | | |
|---|---|---|---|
| VECTOR | D3 | RST | CLK |
| 0 | 0 | 0 | 0 |
| 1 | 0 | 0 | 1 |
| 2 | 0 | 0 | 0 |
| 3 | 0 | 0 | X |
| 4 | 0 | 0 | 0 |
| 5 | 0 | 0 | X |
| 6 | 0 | 0 | 1 |
| 7 | 0 | 0 | X |
| 8 | 0 | 0 | 1 |
| 9 | 0 | 0 | Z |
| 10 | 0 | 0 | 0 |
| 11 | 0 | 0 | Z |
| 12 | 0 | 0 | 1 |
| 13 | 0 | 0 | Z |
| 14 | 0 | 0 | 1 |
| 15 | 0 | 1 | 0 |
| 16 | 0 | 1 | 1 |
| 17 | 0 | 1 | 0 |
| 18 | 0 | 1 | X |
| 19 | 0 | 1 | 0 |
| 20 | 0 | 1 | X |
| 21 | 0 | 1 | 1 |
| 22 | 0 | 1 | X |
| 23 | 0 | 1 | 1 |
| 24 | 0 | 1 | Z |
| 25 | 0 | 1 | 0 |
| 26 | 0 | 1 | Z |
| 27 | 0 | 1 | 1 |
| 28 | 0 | 1 | Z |
| 29 | 0 | 1 | 1 |
| 30 | 1 | 0 | 0 |

| VECTOR | D3 | RST | CLK |
|---|---|---|---|
| n | 0 | 0 | 0 |
| n+1 | 0 | 1 | 0 |
| n+2 | 0 | 0 | 0 |
| n+3 | 0 | X | 0 |
| n+4 | 0 | 0 | 0 |
| n+5 | 0 | X | 0 |
| n+6 | 0 | 1 | 0 |
| n+7 | 0 | X | 0 |
| n+8 | 0 | 1 | 0 |
| n+9 | 0 | Z | 0 |
| n+10 | 0 | 0 | 0 |
| n+11 | 0 | Z | 0 |
| n+12 | 0 | 1 | 0 |
| n+13 | 0 | Z | 0 |
| n+14 | 0 | 1 | 0 |
| n+15 | 0 | 0 | 1 |
| n+16 | 0 | 1 | 1 |
| n+17 | 0 | 0 | 1 |
| n+18 | 0 | X | 1 |
| n+19 | 0 | 0 | 1 |
| n+20 | 0 | X | 1 |
| n+21 | 0 | 1 | 1 |
| n+22 | 0 | X | 1 |
| n+23 | 0 | 1 | 1 |
| n+24 | 0 | Z | 1 |
| n+25 | 0 | 0 | 1 |
| n+26 | 0 | Z | 1 |
| n+27 | 0 | 1 | 1 |
| n+28 | 0 | Z | 1 |

FIG. 5

METHOD FOR TESTING CIRCUIT DESIGN USING EXHAUSTIVE TEST VECTOR SEQUENCE

FIELD OF THE INVENTION

This invention relates to the field of integrated circuits, and more specifically to the testing of integrated circuit designs.

BACKGROUND OF THE INVENTION

An integrated circuit (IC) is a circuit whose components and connecting "wires" are formed by processing distinct areas of a chip of semiconductor material, such as silicon.

Sequential ICs are ICs that include a digital circuit whose operating "state" at an instant in time is determined at least in part by binary information that is stored in the digital circuit. Specifically, sequential ICs typically include both combinational circuitry (e.g., arrays of digital gates) and memory elements. Combinational circuitry generates binary output signals at any instant in time that are entirely dependent upon the input signals presented to the combinational circuitry at that instant. Memory elements store binary information so that it is available, for example, for use by the combinational circuitry. In operation, a sequential IC receives binary input signals from a host system. These binary input signals, together with the binary information stored by the memory elements, determine the binary output signals transmitted from the sequential IC to the host system. The binary input signals and stored binary information also determine the conditions required for changing the binary information stored in the memory elements. Therefore, a time sequence of input signals, output signals and internal memory states determines the operating "state" of the sequential IC.

"Synchronous" sequential ICs utilize clock signals such that all changes to the binary information stored in the memory elements takes place just after each clock signal pulse. A common memory element used in synchronous sequential ICs is referred to as a "flip-flop". A static flip-flop is a circuit that can maintain a binary state indefinitely (as long as power is applied to the IC) until directed by an input signal to switch states. The flip-flop switches states in response to, for example, a rising edge of a clock signal (i.e., when the clock signal changes from "0" (low) to "1" (high)). There are several types of known flip-flops, including D, RS, JK and T type flip-flops.

The development of an IC typically includes generating a circuit design, testing the circuit design to assure that it will perform as desired, and finally, laying out and fabricating a physical IC (or implementing the circuit in a programmable logic device). Circuit design testing typically involves forming a computer-based circuit description, and then using an IC simulation tool to simulate operation of the computer-based circuit description. As used below, "circuit design" refers generally to a circuit, whereas a "computer-based circuit description" is a software-based description of a circuit design that is stored in the memory of a computer. In contrast to a computer-based circuit description, the terms "integrated circuit" and "IC" refer to the physical implementation of the circuit design including, for example, a silicon semiconductor chip that is mounted in a ceramic or plastic package.

FIG. 1(A) shows a block diagram generally illustrating a system for testing circuit designs in accordance with known methods. The system includes a computer 100 such as an Ultra 1 workstation produced by Sun Microsystems, Inc. Computer 100 has a memory 101 for storing software tools including IC simulation software 102, such as the Verilog software program produced by Cadence Design, Inc. Memory 101 also stores a computer-based circuit description 104, which identifies all of the electronic components of a user's circuit design, including all interconnections (input nodes and output nodes) associated with the electronic components. In addition, a portion of memory 101 is reserved for test vector file 106 including signal values that are applied to test nodes of circuit description 104, and for test result file 108 that includes result data regarding the simulated operation of circuit description 104. A user 110 enters circuit description 104 and test vector file 106 into memory 101 using an input device 120, such as a keyboard and/or a mouse. Error messages and other data stored in test result file 108 are transmitted by computer 100, for example, to a display 130.

FIG. 1(B) is a graphical circuit description of a multiplexer (MUX) 140 that forms a part of circuit description 104. MUX 140 receives three input signals including a first data signal D0, a second data input signal D1 and a select input signal SEL. MUX 140 is a combinational electronic component in that when SEL is a logic "1" (e.g., high) signal, MUX 140 passes first data signal D0 to its output terminal, and when SEL is a logic "0" (e.g., low) signal, MUX 140 passes second data signal D0 to its output terminal.

FIGS. 1(C) and 1(D) provide graphical representations of a portion of a test vector file 106 and a test result file 108, respectively. These graphical representations, along with similar graphical representations referred to below, are provided merely to describe data organization and processing related to the conventional testing methods, and do not necessarily describe the actual data organization implemented in test vector file 106 and test result file 108.

Referring to FIG. 1(C), test vector file 106 includes a sequence of test vectors (numbered 0 through 7). Each test vector includes a set of signal values associated with first data signal D0, second data signal D1 and select signal SEL that are applied to the input nodes of MUX 140. Test vector file 106 is shown as being truncated to indicate that test vector values are also provided to other electronic components (not shown) of circuit description 104. In accordance with conventional test methods, circuit description 104 is tested by applying all possible input conditions using an iterative sequence, and by comparing the resulting output signals against expected values. Using a simple example, MUX 140 is tested by transmitting every possible combination of signals to the input terminals of MUX 140. That is, logic "1" and logic "0" values are transmitted to the input terminals of MUX 140 on first data signal D0, second data signal D1 and select signal SEL.

Referring to FIG. 1(D), the circuit responses (results) of circuit description 104 to the vectors applied by test vector file 106 are collected and compared in test result file 108. Test result file 106 is also shown as being truncated to indicate that test results are also provided from other electronic components (not shown) of circuit description 104. Each test vector result includes an expected output value (OE) and an actual output value (OA). The OE values are generated, for example, from a functional description of the circuit design. The OA values are generated, for example, from circuit description 104 that is entered into computer 100 using a graphical description tool. When circuit description 104 meets the requirements defined by the functional description, the OA values generated in response to the test vectors by the graphical representation coincide with the OE values (as shown in FIG. 1(D)). When the circuit description 104 does not meet the requirements defined by the functional description, the OA values differ from the OE values, and an error message is transmitted to display 130 notifying user 110. In response, user 130 typically alters circuit description 104 until errors are avoided.

Although the above-described conventional method of testing circuit designs works well for combinational circuit designs, problems may arise when it is used to test sequential circuit designs.

FIG. 1(E) is a graphical circuit description of a flip-flop (FF) 160 that forms a part of a sequential circuit description 104(2). FF 160 receives three input signals including a data signal D3, a clock signal CLK and a reset signal RST. FF 160 is a sequential electronic component in that the output signal OUT transmitted from output terminal Q changes in response to either data signal D3 or reset signal RST only during the rising edge of the CLK signal (i.e., when the clock signal changes from logic "0" to logic "1").

FIGS. 1(F) and 1(G) provide graphical representations of a portion of a test vector file 106(2) and a test result file 108(2), respectively. Referring to FIG. 1(F), according to the conventional test method, test vector file 106(2) includes the same iterative sequence of test vectors used above with respect to MUX 140, but the sets of signal values are associated with the clock signal CLK, data signal D3 and reset signal RST that are applied to the input nodes of FF 160. FIG. 1(G) shows test result file 108(2) that includes the circuit responses (results) of FF 160 to test vector file 106(2).

A first problem arising from using conventional iterative test vector sequences to test sequential circuit designs is that much of the generated data may be unusable. As mentioned above, the output signal generated by FF 160 changes only when clock signal CLK changes from "0" to "1", and does not test how the circuit design reacts to some signal transitions. Therefore, test vectors 0 through 3 (FIG. 1(F)) fail generate output signal changes even though data signal D3 and reset signal RST change from logic "0" to logic "1". For example, when reset signal RST changes from logic "0" to logic "1" (i.e., transition T1 between vectors 0 and 1), no change occurs in the output because clock signal CLK remains at logic "0" (indicated as C1). Similarly, when data signal D3 changes from logic "0" to logic "1" (i.e., transition T2 between vectors 0 and 1), no change occurs in the output because clock signal CLK remains low. Therefore, valuable time is spent generating test vectors that fail to provide usable results, thereby increasing the cost of IC development.

A second problem arising from using conventional iterative test vector sequences to test sequential circuit designs is that unexpected or erroneous test results may be generated. For example, referring to FIG. 1(F), when the clock signal CLK transitions from logic "0" to logic "1" (transitions T3 between vectors 3 and 4), an indeterminate. result may be generated if any other signals are also changing (such as data signal D3 and reset signal RST which change from logic "1" to logic "0"). These indeterminate results may generate incorrect error messages that may cause a user to spend needless amounts of time looking for errors in the circuit description.

A third problem arising from using conventional iterative test vector sequences to test sequential circuit designs is that the input nodes in some sequential circuits are subjected to floating ("tri-state") signal levels that are between logic "1" and logic "0". Because the conventional test method does not include floating signals in the iterative sequence of test vectors, the test results do not provide information regarding how the circuit design reacts to floating signals. Even more specifically, the test results do not provide information regarding how the circuit design reacts to transitions between logic "1" and "0" values and floating signals.

What is needed is a method for testing sequential circuit designs that overcomes the deficiencies described above with respect to conventional testing methods.

SUMMARY OF THE INVENTION

The present invention is directed to an improved method for testing sequential circuit designs in which an exhaustive sequence of test vectors is applied to the input nodes of edge-sensitive components of a simulated circuit. The test vector values are selected from a group including a logic "1" (high), a logic "0" (low), a "floating" value (i.e., between logic "1" and logic "0") and a randomly generated ("don't care") value. While a predetermined combination of values are applied to all other input nodes of the simulated circuit, the test vector values are applied to a selected input node in a predetermined sequence that produces all possible transitions between the test vector values. By applying all possible transitions to the input terminals of edge-sensitive components, proper operation of the simulated circuit is assured, thereby avoiding costly re-designs that may occur during late development stages due to circuit operation errors.

In accordance with a first aspect, a test vector sequence is applied to selected input nodes that are, for example, associated with an edge-sensitive input terminal of a flip-flop. By applying an exhaustive predetermined sequence of values from the set of logic values to the selected input node of the simulated sequential circuit while maintaining the other input nodes at a fixed level, proper operation of the simulated circuit is thoroughly tested.

In accordance with a second aspect, the logic values applied to the selected input node are selected from a set of logic values including a logic "0" (e.g., low) signal value, a logic "1" (e.g., high) signal value, a randomly-generated (e.g., don't care) value (typically either logic "0" or logic "1"), and a floating state whose signal value is between the logic "0" (low) and logic "1" (high) values. By including a floating signal value to the test vector sequence, proper operation of a user's circuit design can be established under all possible input conditions, thereby avoiding costly re-designs due to circuit failures caused by unexpected operational states. Similarly, a further benefit is provided by also including a randomly generated signal value into the set of logic values.

In accordance with a third aspect, the exhaustive sequence of test vectors includes signal values arranged in an order that produces all possible transitions between the logic values of the set of logic values. By including all possible signal value transitions in the test vector sequence, proper operation of a user's circuit design can be established under all possible input conditions, thereby avoiding costly re-designs due to circuit failures caused by unexpected operational states.

In accordance with a fourth aspect, the exhaustive sequence of test vectors includes signal values arranged in an order that initially applies a logic "0" and then a logic "1" to the selected input node. By applying a logic "0" and a logic "1" before other signal value transitions, glitches in clock-driven circuitry is readily identified.

BRIEF DESCRIPTION OF THE DRAWINGS

FIG. 1(A) shows a block diagram generally illustrating a system utilizing conventional test vectors for testing circuit designs in accordance with known methods.

FIGS. 1(B), 1(C) and 1(D) are graphical representations of data files utilized in accordance with a first example of the conventional circuit design method.

FIGS. 1(E), 1(F) and 1(G) are graphical representations of data files utilized in accordance with a second example of the conventional circuit design method.

FIG. 2 shows a block diagram generally illustrating a system utilizing test vectors for testing circuit designs in accordance with the present invention.

FIG. 3(A) shows a graphical representation of test vector data files utilized in accordance with a first embodiment of the present invention.

FIG. 3(B) is a graphical representation of test vector data files utilized in accordance with a second embodiment of the present invention.

FIG. 3(C) shows a graphical representation of test vector data files utilized in accordance with a third embodiment of the present invention.

FIG. 5 is a graphical representation of a test vector data file utilized in accordance with the fifth embodiment.

DETAILED DESCRIPTION OF THE DRAWINGS

Figure 1E:
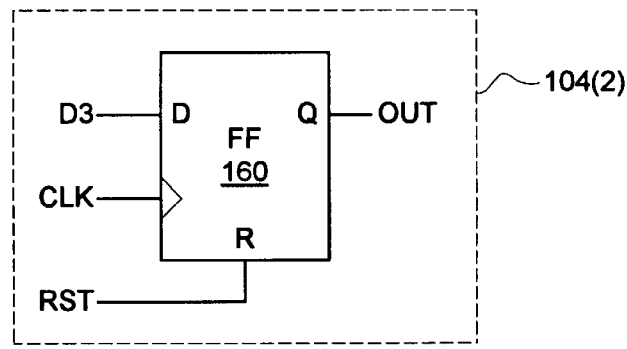

FIG. 2 shows a block diagram generally illustrating a system for testing sequential circuit designs in accordance with the present invention. The system includes a computer 200 such as an Ultra 1 workstation produced by Sun Microsystems, Inc. Computer 200 has a memory 201 for storing software tools including IC simulation software 202, such as Verilog software produced by Cadence Design, Inc. Memory 201 also stores a computer-based sequential circuit description 204, which identifies all of the electronic components of a user's sequential circuit design, including all interconnections (input nodes and output nodes) associated with the electronic components. In addition, a portion of memory 201 is reserved for a test result file 208 and a test vector file 300. Test vector file 300 includes signal values that are applied to specified test nodes of circuit description 204 in accordance with the present invention. Test result file 208 includes result data regarding the simulated operation of circuit description 204 in response to test vector file 300. A user 210 enters circuit description 204 and test vector file 300 into memory 201 using an input device 220, such as a keyboard and/or a mouse. Error messages and other data stored in test result file 208 are transmitted by computer 200, for example, to a display 230.

The present invention is directed to a method for generating an exhaustive sequence of test vectors that are applied to a selected input node of a simulated sequential circuit. The simulated sequential circuit is generated by IC simulation software 202 with reference to circuit description 204, which in turn represents a circuit design created by user 210. A predetermined combination of signal values is applied to other input nodes (i.e., other than the selected input node) of the simulated sequential circuit. With the simulated sequential circuit maintained in this state, the exhaustive sequence of test vectors are transmitted from test vector file 300 to the selected input node in the form of a predetermined sequence of logic values in order to thoroughly test the circuit design represented by the simulated circuit.

In accordance with a first aspect of the present invention, test vector sequence is applied to selected input nodes that are, for example, associated with an edge-sensitive input terminal (such as clock, set or reset) of a flip-flop (or other sequential circuit element) of the simulated sequential circuit. By applying an exhaustive predetermined sequence of values from the set of logic values to the selected input node of the simulated sequential circuit while maintaining the other input nodes at a fixed level, proper operation of the simulated circuit is thoroughly tested. Although the test vector sequence can be applied to other non-edge-sensitive input nodes, the benefits of such testing is not as great as that realized during testing of edge-sensitive input nodes.

In accordance with a second aspect of the present invention, the logic values applied to the selected input node are selected from a set of logic values (signal states) typically applied to the nodes of the simulated sequential circuit. As discussed above, this set of logic values typically includes a logic "0" (e.g., low) signal value, a logic "1" (e.g., high) signal value, a randomly-generated (e.g., don't care) value (typically either logic "0" or logic "1"), and a floating state whose signal value is between the logic "0" (low) and logic "1" (high) values. By including a floating signal value to the test vector sequence, proper operation of a user's circuit design can be established under all possible input conditions, thereby avoiding costly re-designs due to circuit failures caused by unexpected operational states. Similarly, a further benefit is provided by also including a randomly generated signal value into the set of logic values.

In accordance with a third aspect of the present invention, the exhaustive sequence of test vectors includes signal values arranged in an order that produces all possible transitions between the logic values of the set of logic values. As disclosed below with respect to the first and second specific embodiments, the set of logic values includes a logic "0" value, a logic "1" value and a floating state value. In these embodiments, the sequence of test vectors is arranged such that the selected input terminal receives signal values causing transitions between the logic "1" value and the logic "0" value, between the logic "1" value and the floating state value, and between the logic "0" value and the floating state value. As disclosed below with respect to the third and fourth specific embodiments, the set of logic values also includes a randomly-generated value, and the sequence of test vectors is arranged such that the selected input terminal also receives signal values causing transitions between the randomly-generated value and the other logic values. By including all possible signal value transitions in the test vector sequence, proper operation of a user's circuit design can be established under all possible input conditions, thereby avoiding costly re-designs due to circuit failures caused by unexpected operational states.

In accordance with a fourth aspect of the present invention, the exhaustive sequence of test vectors includes signal values arranged in an order that initially applies a logic "0" and then a logic "1" to the selected input node. As discussed above, a flip-flop includes several edge-sensitive input nodes that typically change in response to positive (logic "0" to logic "1") transitions. By applying a logic "0" and then a logic "1" before other signal value transitions, glitches are readily identified. Specifically, the transition from logic "0" to logic "1" is the known or expected "edge" during normal operation of the flip-flop. By following this known or expected edge with other signal value transitions, potential destabilization of the circuit can be identified, thereby allowing a circuit designer to identify and correct glitches during the design phase to avoid costly re-designs.

FIG. 3(A) provides a graphical representation of a simplified test vector file 300-1 in accordance with a first embodiment of the present invention. This graphical representation, along with similar graphical representations in other embodiments discussed below, is provided merely to describe the sequence of test vector values used in accordance with the present invention. Therefore, the appended claims should not necessarily be limited by the graphical representations provided in the figures.

As indicated in FIG. 3(A), the first embodiment utilizes a set of logic values made up of a logic "0" value, a logic "1" value and a floating state (represented by "Z") value. In accordance with the first embodiment, the sequence of test vector (INPUT) values applied to the selected input node includes a first transition from a first logic value to a second logic value, followed immediately by a second transition from the second value to the first value. For example, a first transition involves changing from logic "0" at test vector 0 to logic "1" at test vector 1, and a second transition from logic "1" in test vector 1 to logic "0" in test vector 2. These two transitions are repeated for all values of the logic value set. For instance, the sequence generates transitions from floating state Z (state 3) to logic "0" (state 4), and from logic "0" (state 4) to floating state Z (state 5). Finally, the sequence generates transitions from logic "1" (state 6) to floating state Z (state 7), and from floating state Z (state 7) to logic "1" (state 9). By repeating these A-to-B-to-A transitions for each combination of logic values, potential destabilization states are systematically identified.

FIG. 3(B) provides a graphical representation of a test vector file 300-2 in accordance with a second embodiment of the present invention. Test vector file 300-2 is similar to test vector 300-1 in that it includes all possible transitions between logic values "0", "1" and "Z". However, test vector 300-2 is arranged to minimize the number of test vectors required to perform all of these transitions. That is, the sequence of values applied to the second input node of the simulated sequential circuit are arranged such that the plurality of transitions includes only one transition from a first one of the logic values to a second one of the logic values. For example, a transition from logic "0" to floating state Z occurs only once in the sequence (i.e., during the transition from state 4 to state 5). In contrast, test vector sequence 300-1 (see FIG. 3(A)) includes two transitions from logic "0" to floating state Z (state 2 to state 3, and state 3 to state 4). Referring again to FIG. 3(B), test vector sequence 300-2 is arranged in the order: logic "0" (state 0), logic "1" (state 1), floating state Z (state 2), logic "1" (state 3), logic "0" (state 4), floating state Z (state 5), and back to logic "0" (state 6). By limiting the number of vectors required to perform all possible transitions of the logic values, the testing process is performed in less time than that required to apply test vector 300-1 (FIG. 3(A)).

FIG. 3(C) provides a graphical representation of a test vector file 300-3 in accordance with a third embodiment of the present invention. The third embodiment utilizes a set of logic values made up of a logic "0" value, a logic "1" value, a floating state (Z) value and a randomly generated (don't care) value. Similar to the first embodiment, test vector file 300-3 includes a sequence of test vector (INPUT) values applied to the selected input node that includes a first transition from a first logic value to a second logic value, followed immediately by a second transition from the second value to the first value. However, test vector file 300-3 includes a sequence of test vector values that includes transitions to and from the randomly-generated logic values (i.e., between the logic "1" value and the randomly-generated value, between the logic "0" value and the randomly-generated value, and between the randomly-generated value and the floating state value). Specifically, the predetermined sequence of logic values associated with test vector 300-3 is, in order, logic "0" (state 0), logic "1" (state 1), logic "0" (state 2), randomly-generated value (state 3), logic "0" (state 4), randomly-generated value (state 5), logic "1" (state 6), randomly-generated value (state 7), logic "1" (state 8), floating state Z (state 9), logic "0" (state 10), floating state Z (state 11), logic "1" (state 12), floating state Z (state 13), and logic "1" (state 14).

Figures 3D, 4:
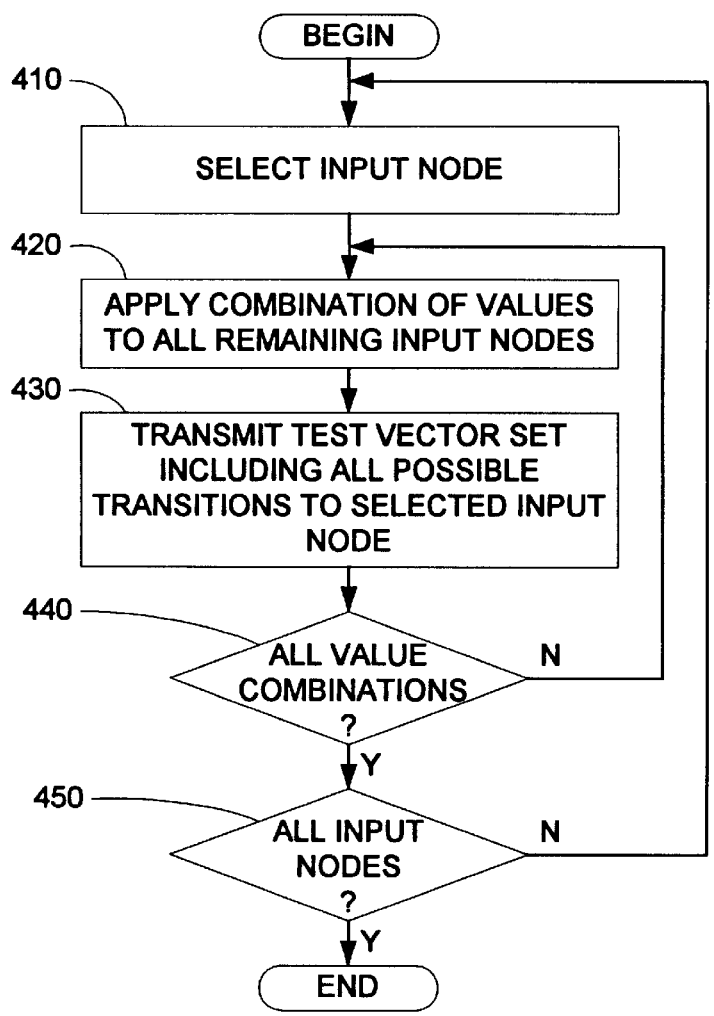
FIG. 3(D) is a graphical representation of test vector data files utilized in accordance with a fourth embodiment of the present invention.
FIG. 4 is a flowchart showing process steps associated with the IC design method according to a fifth embodiment of the present invention.

FIG. 3(D) provides a graphical representation of a test vector file 300-4 in accordance with a fourth embodiment of the present invention. Similar to the second embodiment, Test vector file 300-4 is similar to test vector 300-3 in that it includes all possible transitions between logic values "0", "1", "Z" and "X", but test vector 300-4 is arranged to minimize the number of test vectors required to perform all of these transitions. Specifically, the predetermined sequence of logic values associated with test vector 300-4 is, in order, logic "0" (state 0), logic "1" (state 1), randomly-generated value X (state 2), logic "1" (state 3), floating state Z (state 4), logic "0" (state 5), floating state Z (state 6), logic "1" (state 7), logic "0" (stage 8), randomly-generated value (state 9), and logic "0" (state 10).

In accordance with a fifth embodiment of the present invention, a method for generating an exhaustive sequence of test vector values for a simulated sequential circuit includes applying a sequence of logic value combinations to all input nodes of the simulated sequential circuit other than a selected edge-sensitive input node. Upon application of each logic value combination, the sequence of test vector values generated, for example, in accordance with the first through fourth embodiments (discussed above) are applied to the selected input node. This process is repeated for all of the edge-sensitive input nodes. Because the sequence of test vector values are applied to each selected input node, an exhaustive sequence of test vectors are applied the simulated sequential circuit such that simulates all possible transition events, thereby assuring proper operation of a user's circuit design.

FIG. 4 is a flow diagram showing the basic steps associated with the fifth embodiment.

Referring to FIG. 4, in Step 410, an input node is selected from the list of edge-sensitive input nodes that are associated with a simulated sequential circuit according to circuit description 204 (see FIG. 2). For example, the clock signal CLK and the reset signal RST are transmitted to two edge-sensitive input nodes of flip-flop 160 (see FIG. 1(E) and discussion above). During the first pass through Step 410, one of CLK input signal CLK and reset signal RST is selected. Control then passes to Step 420.

In Step 420, a combination of signal values is applied to all input nodes of circuit description 204 other than the selected input node. These other input nodes include the non-selected edge-sensitive input nodes of circuit description 204. The signal values are applied in a specific combination during each iteration of Step 420. For example, the combination may include applying a logic "0" to all of the other input nodes during a first pass through step 420, and applying logic "1" to all of the other input nodes during a subsequent pass. Of course, all combinations of logic "0" and logic "1" applied to these other input nodes are required to perform an exhaustive test of circuit description 204. Upon completion of this step, control passes to Step 430.

In Step 430, a sequence of test vectors associated with the test vector file 300 is applied to the selected input node. The sequence can be based on any of the first through fourth embodiments described above. Control then passes to Step 440.

In Step 440, the process determines whether all possible combinations of input values have been applied to all input nodes of circuit description 204 other than the selected input node. If all combinations have not been applied (N), then control passes back to Step 420 for application of a next sequential combination and subsequent application of the test vector sequence in Step 430. The loop formed by Step 420, 430 and 440 is repeated until all combinations have been applied to these other input nodes, then control passes to Step 450.

In Step 450, the process determines whether step 420 (applying the sequence of test vectors 300) has been performed for all edge-sensitive input nodes of circuit description 204. If the sequence of test vectors has not been applied to one or more edge-sensitive input nodes of circuit description 204 (N), then control passes back to Step 410, wherein a new input node is selected and the loop formed by Steps 420, 430 and 440 for the new input node. After the test vector sequence has been applied to all edge-sensitive input nodes of circuit description 204 (Y), then the process terminates (END), and control passes to the host circuit simulation program.

FIG. 5 provides a graphical representation of a test vector file 300-5 in accordance with the fifth embodiment of the present invention. Test vector file 300-5 provides an example of signal values applied to all input nodes of flip-flop 160 (see FIG. 1(E), above) in accordance with the fifth embodiment. Test vectors 0 through 14 illustrate a first pass through Steps 410, 420 and 430 during which the sequence associated with test vector file 300-3 (see FIG. 3(C)) is applied to selected input node CLK while input nodes D3 and RST are maintained at logic "0". Next, test vectors 15 through 29 illustrate a second pass through Steps 410, 420 and 430 during which the sequence associated with test vector file 300-3 is applied to selected input node CLK while input node D3 is maintained at logic "0" and input node RST is maintained at logic "1". Test vector 30 illustrates the first vector of a third pass in which input node D3 is maintained at logic "1" and input node RST is maintained at logic "0". After the sequence with input node D3 maintained at logic "1" and input node RST maintained at logic "0", a fourth sequence is performed with input node D3 maintained at logic "1" and input node RST maintained at logic "1". Subsequent test vectors n through n+14 illustrate a change in the selected input node (Step 410) to input node RST, and an additional pass through Steps 410, 420 and 430 during which the sequence associated with test vector file 300-3 is applied to selected input node RST while input nodes D3 and CLK are maintained at logic "0". Finally, test vectors n+15 through n+28 illustrate a subsuent pass through Steps 410, 420 and 430 during which the sequence associated with test vector file 300-3 is applied to selected input node RST while input node D3 is maintained at logic "0" and input node CLK is maintained at logic "1".

Although the present invention has been described with respect to certain specific embodiments, it will be clear to those skilled in the art that the inventive-features of the present invention are applicable to other embodiments as well, all of which are intended to fall within the scope of the present invention. For example, the test methods described above may be utilized in conjunction with the conventional methods (described above), whereby the novel methods described above are utilized to test edge-sensitive input nodes, and the conventional methods are utilized to test input nodes of combinational components.

I claim:

1. A method for testing sequential circuit designs in which an exhaustive sequence of test vectors is applied to input nodes of a simulated sequential circuit, the method comprising the steps of:

applying a predetermined first value from a set of logic values to a first input node of the simulated sequential circuit; and applying a predetermined sequence of values from the set of logic values to a second input node of the simulated sequential circuit, wherein the set of logic values includes a logic "1" (high) value, a logic "0" (low) value, and a floating state value, and wherein the predetermined sequence of values produces transitions between the logic "1" value and the logic "0" value, between the logic "1" value and the floating state value, and between the logic "0" value and the floating state value.

2. The method according to claim 1, wherein the second input node of the simulated sequential circuit is associated with an edge-sensitive input terminal of a flip-flop of the simulated sequential circuit.

3. The method according to claim 1, wherein the step of applying a predetermined first value from the set of logic values to the first input node of the simulated sequential circuit comprises applying a logic "0" or a logic "1".

4. The method according to claim 1, wherein the step of applying a predetermined sequence of values from the set of logic values to the second input node of the simulated sequential circuit comprises applying an initial pair of values in the sequence of logic "0" and then logic "1".

5. The method according to claim 1, wherein the step of applying a predetermined sequence of values from the set of logic values to the second input node of the simulated sequential circuit comprises a first transition from a first value to a second value, followed immediately by a second transition from the second value to the first value.

6. The method according to claim 5, wherein the predetermined sequence of logic values is, in order, logic "0", logic "1", logic "0", floating state, logic "0", floating state, logic "1", floating state, and logic "1".

7. The method according to claim 1, wherein the step of applying a predetermined sequence of values from the set of logic values to the second input node of the simulated sequential circuit comprises a plurality of transitions between the logic values of the set of logic values, and wherein the predetermined sequence of values are arranged such that the plurality of transitions includes only one transition from a first logic value to a second value.

8. The method according to claim 7, wherein the predetermined sequence of values is, in order, logic "0", logic "1", floating state, logic "1", logic "0", floating state, and logic "0".

9. The method according to claim 1, wherein the set of logic values further includes a randomly-generated value, and wherein the predetermined sequence of values further produces transitions between the logic "1" value and the randomly-generated value, between the logic "0" value and the randomly generated value, and between the randomly generated value and the floating state value.

10. The method according to claim 9, wherein the predetermined sequence of logic values is, in order, logic "0", logic "1", logic "0", randomly-generated value, logic "0", randomly-generated value, logic "1", randomly-generated value, logic "1", floating state, logic "0", floating state, logic "1", floating state, and logic "1".

11. The method according to claim 9, wherein the predetermined sequence of values is, in order, logic "0", logic "1", randomly-generated value, logic "1", floating state, logic "0", floating state, logic "1", logic "0" randomly-generated value, and logic "0".

12. A method for testing sequential circuit designs in which an exhaustive sequence of test vectors is applied to input nodes of a simulated sequential circuit, the method comprising the steps of:

selecting an input node of the simulated sequential circuit;

applying a combination of values selected from a set of logic values to all other input nodes of the simulated sequential circuit other than the selected input node; and applying a predetermined sequence of values from the set of logic values to the selected input node, wherein the set of logic values includes a logic "1" (high) value, a logic "0" (low) value, and a floating state value, and wherein the predetermined sequence of values produces transitions between the logic "1" value and the logic "0" value, between the logic "1" value and the floating state value, and between the logic "0" value and the floating state value.

13. The method according to claim 12, wherein the step of applying a predetermined sequence of values from the set of logic values to the selected input node of the simulated sequential circuit comprises applying an initial pair of values in the sequence of logic "0" and then logic "1".

14. The method according to claim 12, wherein the step of applying a predetermined sequence of values from the set of logic values to the selected input node of the simulated sequential circuit comprises a first transition from a first value to a second value, followed immediately by a second transition from the second value to the first value.

15. The method according to claim 14, wherein the predetermined sequence of logic values is, in order, logic "0", logic "1", logic "0", floating state, logic "0", floating state, logic "1", floating state, and logic "1".

16. The method according to claim 15, wherein the step of applying a predetermined sequence of values from the set of logic values to the selected input node of the simulated sequential circuit comprises a plurality of transitions between the logic values of the set of logic values, and wherein the predetermined sequence of values are arranged such that the plurality of transitions includes only one transition from a first logic value to a second value.

17. The method according to claim 16, wherein the predetermined sequence of values is, in order, logic "0", logic "1", floating state, logic "1", logic "0", floating state, and logic "0".

18. The method according to claim 12, wherein the set of logic values further includes a randomly-generated value, and wherein the predetermined sequence of values further produces transitions between the logic "1" value and the randomly-generated value, between the logic "0" value and the randomly generated value, and between the randomly generated value and the floating state value.

19. The method according to claim 18, wherein the predetermined sequence of logic values is, in order, logic "0", logic "1", logic "0", randomly-generated value, logic "0", randomly-generated value, logic "1", randomly-generated value, logic "1", floating state, logic "0", floating state, logic "1", floating state, and logic "1".

20. The method according to claim 18, wherein the predetermined sequence of values is, in order, logic "0", logic "1", randomly-generated value, logic "1", floating state, logic "0", floating state, logic "1", logic "0" randomly-generated value, and logic "0 ".

* * * * *